US009999168B2

(12) United States Patent
Otsubo et al.

(10) Patent No.: US 9,999,168 B2
(45) Date of Patent: Jun. 12, 2018

(54) BOARD CONVEYANCE DEVICE (71) Applicant: FUJI MACHINE MFG. CO., LTD., Chiryu (JP)

(72) Inventors: Satoru Otsubo, Anjo (JP); Junichi Yamamuro, Kariya (JP)

(73) Assignee: FUJI MACHINE MFG. CO., LTD., Chiryu (CN)

( * ) Notice: Subject to any disclaimer, the term of this patent is extended or adjusted under 35 U.S.C. 154(b) by 0 days. days.

(21) Appl. No.: 15/127,213

(22) PCT Filed: Mar. 20, 2014

(86) PCT No.: PCT/JP2014/057814
§ 371 (c)(1),
(2) Date: Sep. 19, 2016

(87) PCT Pub. No.: WO2015/140995
PCT Pub. Date: Sep. 24, 2015

(65) Prior Publication Data
US 2017/0099750 A1  Apr. 6, 2017

(51) Int. Cl.
*H05K 13/02* (2006.01)
*B65G 47/82* (2006.01)
*H05K 13/00* (2006.01)

(52) U.S. Cl.
CPC ................................ *H05K 13/0061* (2013.01)

(58) Field of Classification Search
CPC ..... H05K 13/02; H05K 13/0061; B65G 47/82
(Continued)

(56) References Cited

U.S. PATENT DOCUMENTS 5,456,001 A * 10/1995 Mori .................... H05K 13/021
29/703
5,692,292 A * 12/1997 Asai .................... H05K 13/0061
198/341.04
(Continued)

FOREIGN PATENT DOCUMENTS

EP  2 043 420 A1  4/2009
EP  3122165  * 1/2017 ............. H05K 13/02
(Continued)

OTHER PUBLICATIONS

International Search Report dated Jun. 10, 2014, in PCT/JP2014/057814 filed Mar. 20, 2014.
(Continued)

*Primary Examiner* — Douglas A Hess
(74) *Attorney, Agent, or Firm* — Oblon, McClelland, Maier & Neustadt, L.L.P.

(57) ABSTRACT

A board conveyance device provided with multiple engaging sections that engage with a circuit board. When the conveyance direction is a first direction and the board is large, a claw out of two claws is set to a stopping state. A shuttle is moved up to the movement end on the downstream side in the first direction and two arms rotate. A lever rotates accompanying rotation of a rotating body to a disengaged position by a lever rotating section of a stopping device and an arm unit is able to be disconnected from a moving body. An arm holding section engages with an engaging section to prevent movement in the x direction. The moving body is moved in a second direction with the arm unit held by the stopping device. The claw is set to be in the stopping state and is not used in conveyance of the board.

5 Claims, 10 Drawing Sheets (58) Field of Classification Search
USPC ............... 198/750.1, 750.11, 750.2, 751
See application file for complete search history.

(56) References Cited

U.S. PATENT DOCUMENTS

| | | | | |
|---|---|---|---|---|
| 6,073,342 A * | 6/2000 | Asai | .................. | H05K 13/0061 198/586 |
| 6,088,911 A * | 7/2000 | Isogai | ................ | H05K 13/0413 198/470.1 |
| 6,131,721 A * | 10/2000 | Arakawa | .......... | H01L 21/67706 198/468.3 |
| 6,170,633 B1 * | 1/2001 | Asai | ....................... | H05K 13/02 198/346.1 |
| 6,170,641 B1 * | 1/2001 | Kuster | .............. | H05K 13/0061 198/468.2 |
| 8,177,048 B2 * | 5/2012 | Sato | ....................... | H01F 38/14 198/619 |
| 2003/0111517 A1 | 6/2003 | Takaguchi et al. | | |
| 2008/0092680 A1 * | 4/2008 | Kim et al. | | |
| 2009/0277002 A1 | 11/2009 | Wada et al. | | |
| 2012/0011714 A1 * | 1/2012 | Hattori et al. | | |
| 2012/0175223 A1 * | 7/2012 | Breen et al. | | |
| 2016/0037693 A1 * | 2/2016 | Kurashina et al. | | |
| 2016/0330880 A1 * | 11/2016 | Morikawa | | |

FOREIGN PATENT DOCUMENTS

| | | |
|---|---|---|
| JP | 61-135200 A | 6/1986 |
| JP | 62-136444 U | 8/1987 |
| JP | 2-229499 A | 9/1990 |
| JP | 4-299898 A | 10/1992 |
| JP | 2003-188517 A | 7/2003 |

OTHER PUBLICATIONS

Extended European Search Report dated Sep. 29, 2017 in Patent Application No. 14885944.0.

* cited by examiner

BOARD CONVEYANCE DEVICE

TECHNICAL FIELD

The present application relates to a board conveyance device that conveys circuit boards.

BACKGROUND ART

PTL 1 discloses a board conveyance device that is provided with one slider and two arms that are fixed to the slider, and conveys one circuit board along rails using the two arms.

PTL 2 discloses a board conveyance device that is provided with multiple pushers and a moving device that moves the multiple pushers. In the board conveyance device, multiple circuit boards that are respectively positioned at a standby position, a fluxer position, a preheating position, and a solder attachment position are moved simultaneously to the next process working position by the multiple pushers.

CITATION LIST

Patent Literature

PTL 1: JP-A-4-299898
PTL 2: JP-A-2003-188517

SUMMARY

An object of the present disclosure is to improve the ease of use of a board conveyance device that includes multiple engaging sections, to make it possible to convey, for example, even large circuit boards, and the like.

Effects

The board conveyance device according to the present disclosure includes multiple engaging sections, with one out of the multiple engaging sections being in a stopping state.

In a case where, for example, all of the multiple engaging sections are in a state in which it is possible for circuit boards to be conveyed, it is possible for a large number of the circuit boards to be conveyed simultaneously, and it is possible to improve work efficiency. If one out of the multiple engaging sections is in a stopping state, it is possible to convey larger circuit boards compared to a case where all of the multiple engaging sections are in a state in which conveyance is possible. In this manner, with this board conveyance device, it is possible to improve the ease of use, since conveyance is possible even when the sizes of the circuit boards are different.

Forms of the Disclosure

Forms of the disclosure will be described below.

(1) A board conveyance device including multiple engaging sections that are able to engage with a circuit board, and a selective stopping device that selectively sets one out of the multiple engaging sections to be in a stopping state, in which one or more circuit boards is conveyed using one or more out of the multiple engaging sections excluding the engaging section which is set to be in the stopping state by the selective stopping device.

The shape of the engaging section is not limited, and it is possible to provide, for example, a claw that is provided on an arm as the engaging section. In addition, the shape or the form of the multiple engaging sections is not limited, and it is possible to provide, for example, multiple claws provided on one arm, multiple claws provided respectively on multiple arms (it is possible for the multiple arms to include arms that are provided with one claw and arms that are provided with multiple claws), or the like.

(2) The board conveyance device according to (1), in which the selective stopping device sets one out of the multiple engaging sections to be in the stopping state by determining based on the conveyance direction of the circuit board.

(3) The board conveyance device according to (1) or (2), in which the selective stopping device sets one out of the multiple engaging sections to be in the stopping state based on information related to the size of the circuit board to be conveyed in the board conveyance device.

(4) The board conveyance device according to any of (1) to (3), further including a moving device that is provided with an actuator that moves the multiple engaging sections and one driving source that drives the actuator, in which the selective stopping device includes a selective movement stopping section which sets one out of the multiple engaging sections to be in the stopping state, which is a state in which the engaging section does not move even when the one driving source is in an operational state. The movement includes linear movement, horizontal movement, rotation, and the like.

(5) The board conveyance device according to (4), in which the actuator simultaneously moves the multiple engaging sections.

The actuator may simultaneously move the multiple engaging sections, or may move the multiple engaging sections at different timings, or the like using the one driving source.

(6) The board conveyance device according to (4) or (5), in which the actuator is a rotation actuator that rotates the multiple engaging sections between an operable position where engagement with the circuit board is possible and a retraction position where the multiple engaging sections are disengaged from the circuit board, the driving source is a rotation driving source that drives the rotation actuator, the moving device is an engaging section rotating device that is provided with the rotation actuator and the rotation driving source, and the selective stopping device includes a selective rotation stopping section which sets one out of the multiple engaging sections to be in the stopping state, which is a state in which the engaging section does not rotate even when the one rotation driving source is in an operational state.

(7) The board conveyance device according to (6), in which the engaging section rotating device includes a rotating body that is rotated by the rotation actuator, the board conveyance device includes multiple engaging section holding sections that are provided to correspond to each of the multiple engaging sections, that each hold an engaging section, and that are able to be connected to and disconnected from the one rotating body, and the selective stopping device includes a holding section disconnecting section which sets one out of the multiple engaging sections to be in the stopping state by disconnecting an engaging section holding section that corresponds to the one out of the multiple engaging sections from the rotating body.

(8) The board conveyance device according to (7), in which each of the multiple engaging section holding sections includes a lever that is able to engage with and disengage from the rotating body, and the holding section disconnecting section includes a disconnecting rotation device control section that disconnects the one engaging section holding section from the rotating body by rotating the lever that is provided in the corresponding engaging section holding section from an engagement position in which the lever is engaged with the rotating body to a disengaged position in which the lever is disengaged from the rotating body, by rotating the multiple engaging sections using the engaging section rotating device.

(9) The board conveyance device according to (4) or (5), in which the movement actuator is a horizontal movement actuator that moves the multiple engaging sections horizontally in a conveyance direction of the circuit board, the driving source is a horizontal movement driving source that drives the horizontal movement actuator, and the selective stopping device includes a selective horizontal movement stopping section that sets one out of the multiple engaging sections to be in the stopping state, which is a state in which the engaging section does not move in the conveyance direction even when the horizontal movement driving source is in an operational state.

(10) The board conveyance device according to anyone of (1) to (9), further including (i) an engaging section rotating device that is provided with (a) a rotation actuator that rotates the multiple engaging sections between an operable position where engagement with the circuit board is possible and a retract position where the plurality of engaging sections are disengaged from the circuit board and (b) one rotation driving source that drives the rotation actuator, and (ii) an engaging section horizontal moving device that is provided with (a) a horizontal movement actuator that moves the multiple engaging sections in the conveyance direction of the circuit board and (b) one horizontal movement driving source that drives the horizontal movement actuator, in which the selective stopping device includes a selective movement stopping section which sets one out of the multiple engaging sections to be in the stopping state, which is a state in which the engaging section is stationary even when at least one of the one rotation driving source and the one horizontal movement driving source is in an operational state.

(11) The board conveyance device according to any one of (1) to (10), in which the selective stopping device is provided at a position that is outside the range of movement of the multiple engaging sections during conveyance of the circuit board.

(12) The board conveyance device according to any one of (1) to (11), in which the selective stopping device includes an engaging section holding section that maintains the one engaging section, which is in the stopping state, in the stopping state.

(13) A board conveyance device including multiple engaging sections that are able to engage with a circuit board, and a conveyance state switching device that is able to switch between a first conveyance state in which it is possible to convey a first set number of circuit boards using a first set number of engaging sections out of the multiple engaging sections and a second conveyance state in which a second set number of circuit boards are conveyed using a second set number of engaging sections out of the multiple engaging sections, the second set number being smaller than the first set number.

It is possible for the technological characteristics according to any of (1) to (12) to be adopted in the board conveyance device according to (13).

(14) A board conveyance device including multiple engaging sections that are able to engage with a circuit board, and an individual conveyance state switching device that is able to switch between an operational state in which it is possible for the circuit board to be conveyed and a stopping state in which it is not possible for the circuit board to be conveyed for each of at least one out of the multiple engaging sections.

It is possible for the technological characteristics according to any of (1) to (13) to be adopted in the board conveyance device according to (14).

(15) The board conveyance device according to (13) or (14), further including one or more moving devices that move the multiple engaging sections using one driving source.

The moving device moves the multiple engaging sections in one direction using the one driving source. There are cases where the board conveyance device includes multiple of the moving devices, and the multiple moving devices move each of the multiple engaging sections with orientations which are different to each other. The movement includes linear movement, horizontal movement, rotation, and the like.

BRIEF DESCRIPTION OF DRAWINGS

FIGS. 8(1) to (4) are operational views in cases of separation of linking between an arm holding section (without the arm) and a moving body that is included in the shuttle conveyance device.

FIGS. 9(1) to (4) are operational views in cases of separation of linking between the moving body and an arm unit that includes the arm holding section.

DESCRIPTION OF EMBODIMENTS

Figure 1:
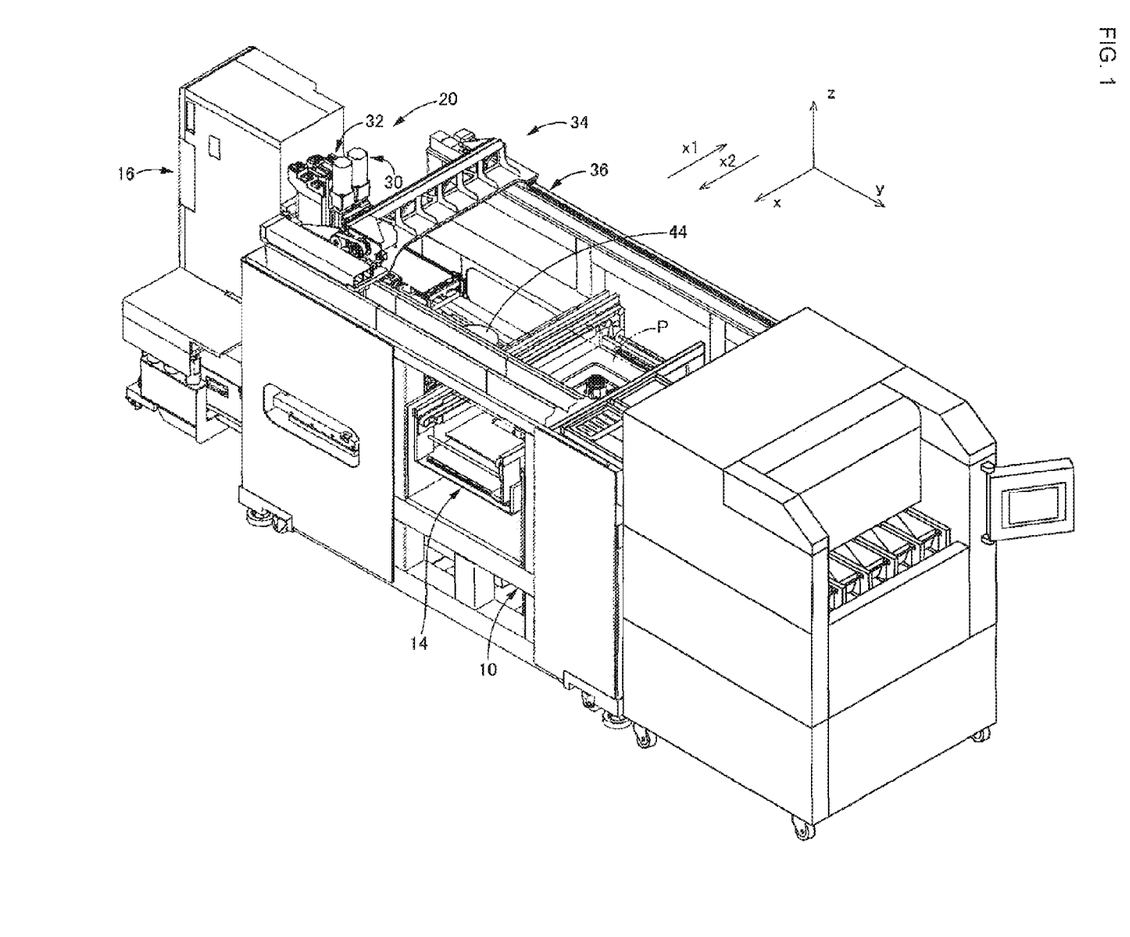
FIG. 1 is a perspective view illustrating an electronic circuit assembly apparatus that is provided with a board conveyance device according to an embodiment of the present disclosure.

An automated assembly device, which includes a board conveyance device that is an embodiment of the present disclosure, will be described below. An electronic circuit assembly device, which is a type of automated assembly device, is illustrated in FIG. 1. The electronic circuit assembly device includes (a) assembly device main body 10, (b) board conveyance device 14, (c) component supply device 16, (d) component mounting device 20, and the like.

Board conveyance device 14 conveys and holds circuit boards P (hereinafter, referred to simply as board P) in a horizontal posture. In FIG. 1, x is the conveyance direction of board P using board conveyance device 14, y is the width direction of board P, and z is the thickness direction of board P, that is, the up and down direction of the electronic circuit assembly device. The x direction, the y direction, and the z direction are all orthogonal to each other.

Note that, there are cases where board conveyance device 14 conveys board P in direction x1 and there are cases where board conveyance device 14 conveys board P in direction x2; the electronic circuit assembly device can be applied in either of these cases. In other words, the conveyance direction (x direction) includes both forward and reverse directions (both direction x1 and direction x2). The same applies to the width direction (the y direction) and the up and down direction (the z direction). Board conveyance device 14 will be described later.

Figure 2:
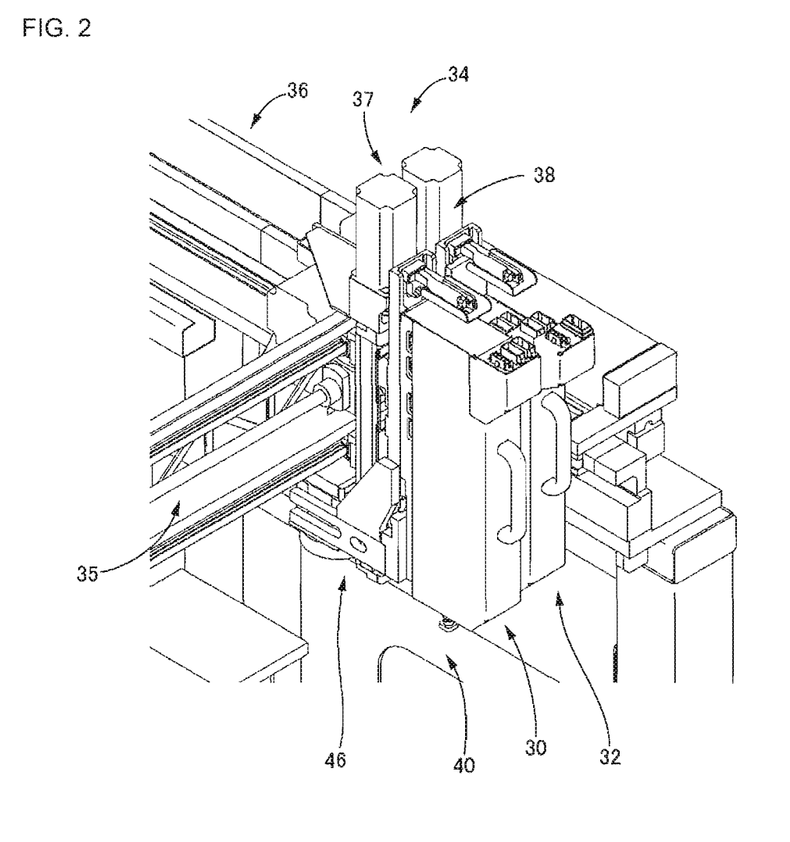
FIG. 2 is a perspective view illustrating a component mounting device of the electronic circuit assembly apparatus.

Component supply device 16 supplies components that are to be mounted on board P and, for example, it is possible for component supply device 16 to include multiple tape feeders or multiple trays, and the like. The component mounting device 20 receives components that are supplied by component supply device 16 and mounts the components at positions that are set in advance on the board P that is held in board conveyance device 14. As shown in FIG. 2, component mounting device 20 includes two working heads, 30 and 32, and working head moving device 34. Working head moving device 34 includes x direction moving device 35, y direction moving device 36, and z direction moving devices 37 and 38. Working heads 30 and 32 are integrally moved to any position on a horizontal plane using x direction moving device 35 and y direction moving device 36, and are able to be moved in the z direction independently from each other using z direction moving devices 37 and 38. It is possible for working heads 30 and 32 to each be provided with, for example, component holding tool 40 that holds a component (it is possible to use, for example, a chuck, a suction nozzle, or the like) and the like. Note that, reference numerals 44 and 46 are cameras; camera 44 is provided on assembly device main body 10, and camera 46 is held by working head 30.

Figure 3:
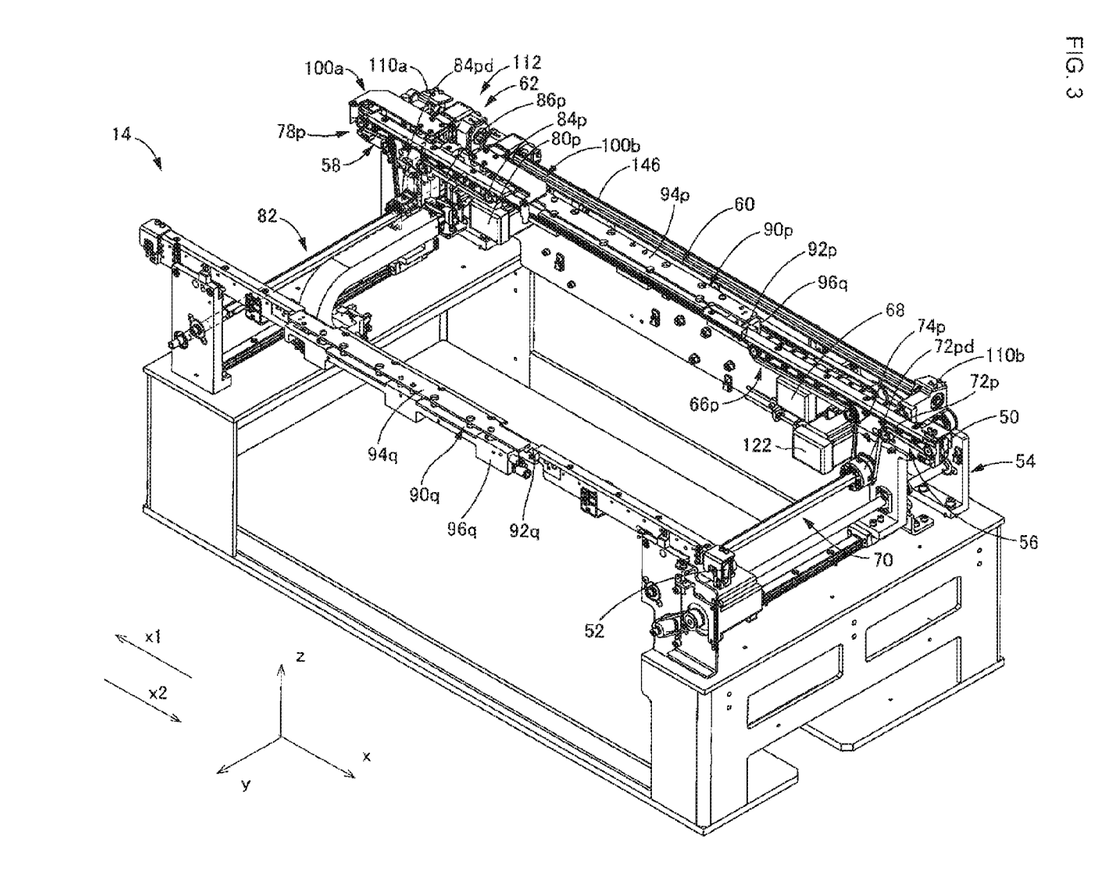
FIG. 3 is a perspective view illustrating the board conveyance device.

As shown in FIG. 3, board conveyance device 14 includes (a) a pair of guides, 50 and 52, which are provided spaced apart from each other in the y direction and which extend in the x direction, (b) width changing apparatus 54 that is able to change the spacing between the pair of guides 50 and 52 (spacing in the y direction), (c) first conveyance device 56 that is provided on one end portion of the pair of guides 50 and 52, (d) second conveyance device 58 that is provided on the other end portion of the pair of guides 50 and 52, (e) board holding device 60 that is provided between first conveyance device 56 and second conveyor device 58, (f) shuttle conveyance device 62 that moves board P at least between first conveyance device 56 and board holding device 60, and between board holding device 60 and second conveyance device 58, and the like.

First Conveyance Device and Second Conveyance Device

The conveyance devices convey board P by operating conveyance belts. First conveyance device 56 may include (a) first conveyors 66p and 66q that are respectively provided on guides 50 and 52 (conveyor 66p provided on guide 50 is illustrated, illustration of conveyor 66q provided on guide 52 is omitted, and the same applies to second conveyance device 58), (b) first conveyor motor 68, (c) driving transmission section 70 that transfers the drive force of first conveyor motor 68 to first conveyors 66p and 66q, and the like. First conveyors 66p and 66q each include multiple pulleys 72p and 72q and conveyance belts 74p and 74q that are wound around the multiple pulleys 72p and 72q, and rotational driving of first conveyor motor 68 is transferred to first conveyors 66p and 66q via drive pulleys 72pd and 72gd. Second conveyance device 58 is formed with a configuration that is the same as first conveyance device 56 and includes (a) second conveyors 78p and 78q that are respectively provided on guides 50 and 52, (b) second conveyor motor 80, (c) driving transmission section 82, and the like. Second conveyors 78p and 78q each include conveyance belts 86p and 86q and multiple pulleys 84p and 84q that include drive pulleys 84pd and 84qd.

Note that, in a case where the conveyance direction of the board is x1, first conveyance device 56 functions as a conveyance device on the IN side and second conveyance device 58 functions as a conveyance device on the OUT side. In a case where the conveyance direction of the board is x2, second conveyance device 58 functions as a conveyance device on the IN side and first conveyance device 56 functions as a conveyance device on the OUT side.

Board Holding Device

Board holding device 60 is for clamping board P and includes board holding sections 90p and 90q that are respectively provided on guides 50 and 52. Board holding sections 90p and 90q each include (a) rails 92p and 92q that hold board P from below, (b) clampers 94p and 94q that press board P from above, (c) clamper driving sections 96p and 96q, and the like. Clampers 94p and 94q are switched using clamper driving sections 96p and 96q between a clamp release position and a clamping position where board P is gripped along with the rails 92p and 92q in the up and down direction.

Shuttle Conveyance Device

Figure 4:
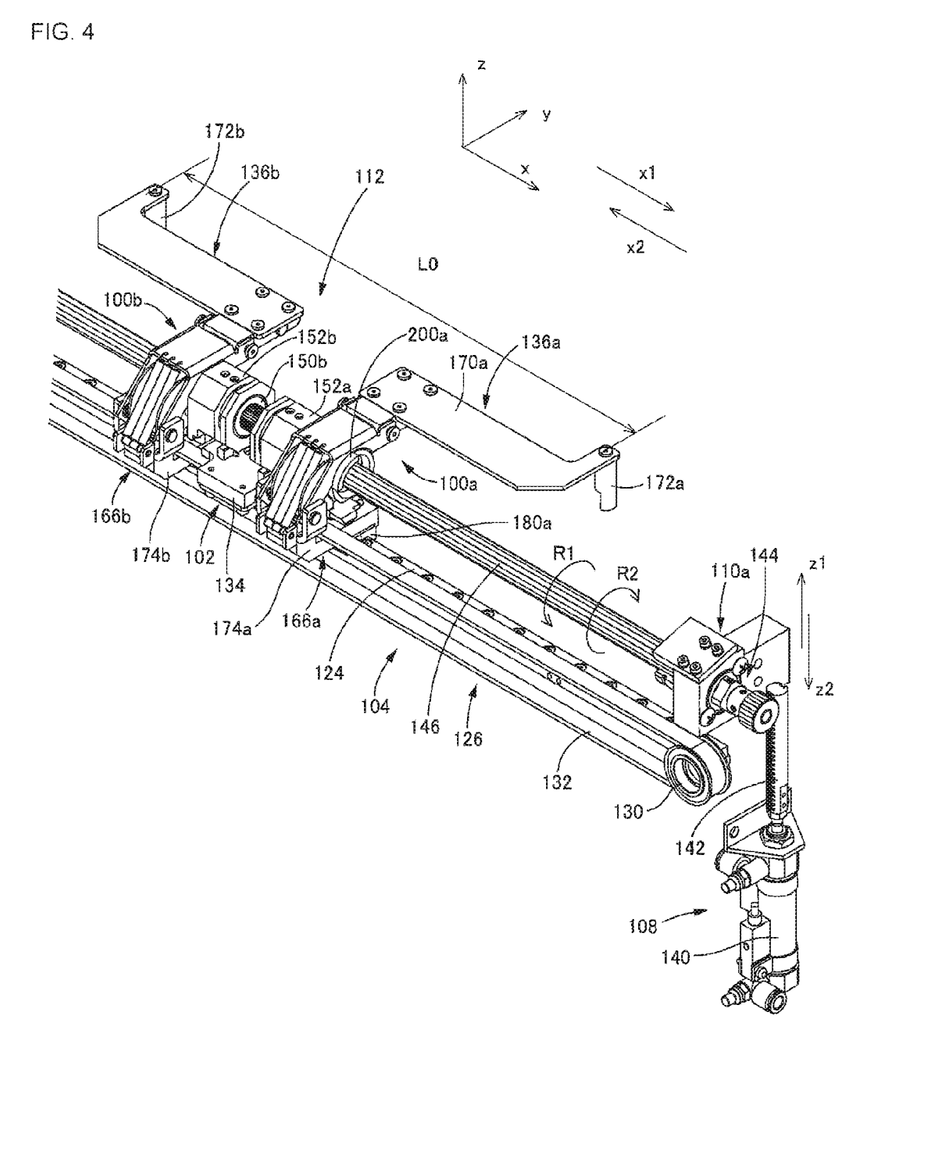
FIG. 4 is a perspective view illustrating a shuttle conveyance device of the board conveyance device.
Figure 5:
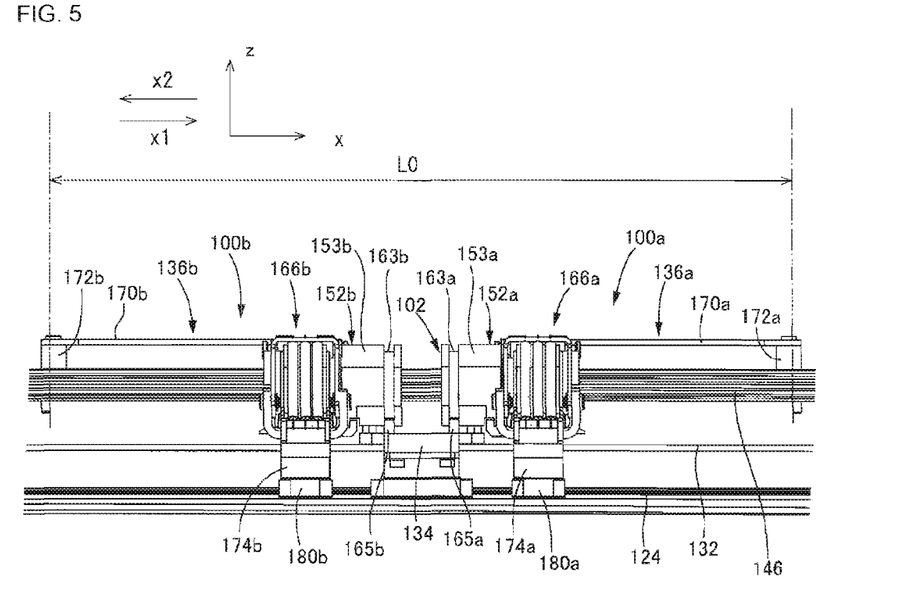
FIG. 5 is a front view illustrating the main portions of the shuttle conveyance device.
Figure 6:
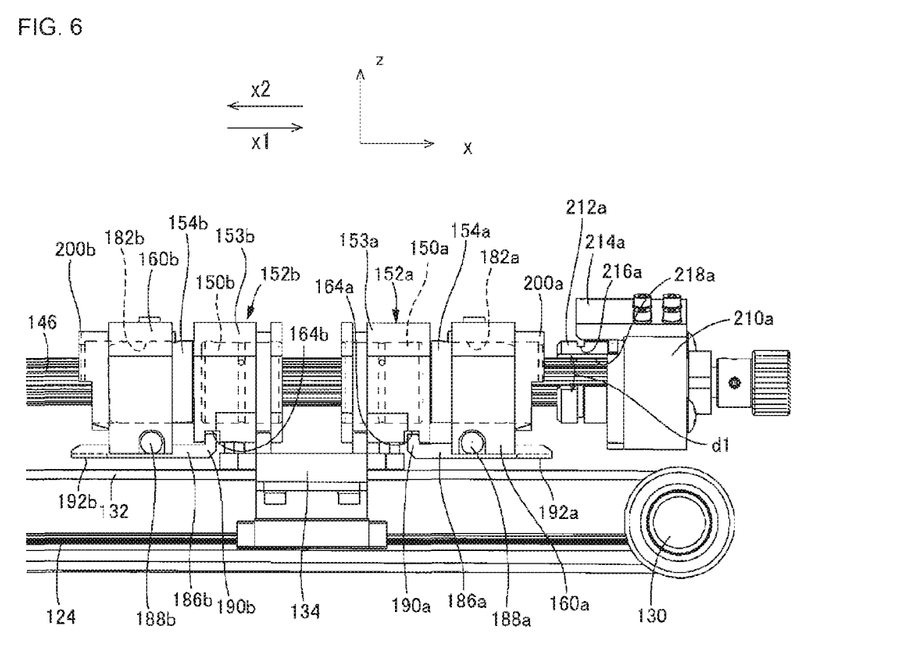
FIG. 6 is a front view illustrating a main portion of the shuttle conveyance device without arms.

As shown in FIGS. 4 to 6, shuttle conveyance device 62 moves board P by pushing board P from behind and is provided along guide 50. Shuttle conveyance device 62 includes (a) two arm units, 100a and 100b, (b) moving body 102 that is provided between the two arm units 100a and 100b, (d) shuttle horizontal moving device 104, (e) arm rotating device 108, (f) stopping devices 110a and 110b (refer to FIG. 3), and the like. Each of the two arm units 100a and 100b and moving body 102 are each able to be connected and disconnected, and shuttle 112 is configured by moving body 102 and at least one of the arm units 100a and 100b which are connected to moving body 102.

{Shuttle Horizontal Moving Device}

Shuttle horizontal moving device 104 moves shuttle 112 horizontally in a linear manner in the x direction and includes (a) one shuttle motor 122 (refer to FIG. 3) as a horizontal movement driving source that is able to rotate in both forward and reverse directions, (b) shuttle guide 124 that extends parallel to guide 50, (c) drive transfer apparatus 126 that converts the rotation of shuttle motor 122 into linear movement and that transfers the drive force of shuttle motor 122 to shuttle 112, and the like. Drive transfer apparatus 126 includes (x) multiple pulleys 130 that are provided on the main body of board conveyance device 14 such as on guide 50 so as to be able to rotate (one of the pulleys is included in FIGS. 4 and 6), (y) shuttle conveyance belt 132 that is wound around the output shaft of shuttle motor 122 and the multiple pulleys 130, (z) slider 134 that engages with shuttle conveyance belt 132 so that relative movement is not possible and that engages with shuttle guide 124 so that relative movement is possible, and the like.

Arm Rotating Device

Figure 10A:
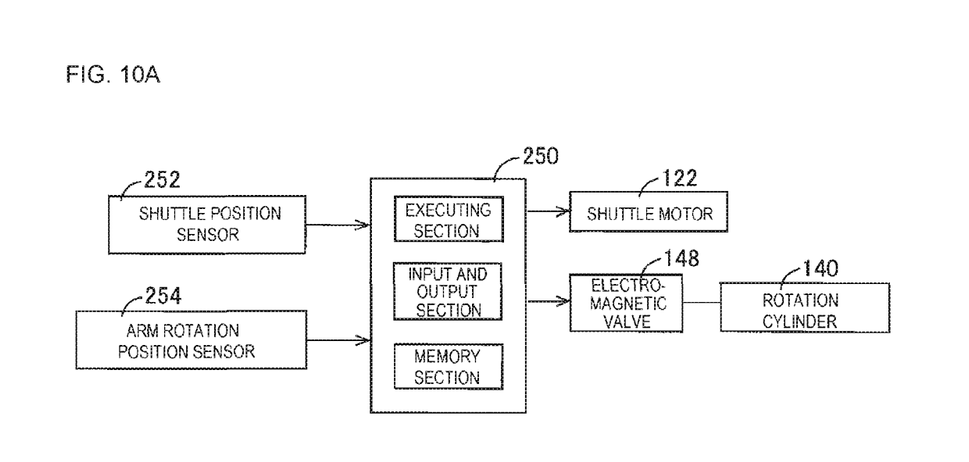
FIG. 10A is a block diagram illustrating the periphery of a control device of the board conveyance device.

Arm rotating device 108 rotates arms 136a and 136b of arm units 100a and 100b and includes (a) one rotation cylinder (air cylinder) 140 as the rotation driving source, (b)

rack and pinion mechanism 144 that converts the horizontal movement of movable member (piston rod) 142 of rotation cylinder 140 in the z direction to rotational movement, (c) spline shaft 146 that is the output shaft of rack and pinion mechanism 144 and that extends parallel to guide 50, and the like. In rotation cylinder 140, movement of movable member 142 is controlled by controlling the high-pressure air supply state via control of electromagnetic valve 148 (refer to FIG. 10). Spline shaft 146 is rotated in direction R1 when movable member 142 is moved in direction z1 and is rotated in direction R2 when movable member 142 is moved in direction z2.

Spline nuts 150a and 150b fit together in spline shaft 146 so as to be able to rotate integrally and so that relative movement is possible in the x direction.

Moving Body

Moving body 102 includes slider 134 and spline nuts 150a and 150b, and is moved using shuttle horizontal moving device 104 and arm rotating device 108. Arm units 100a and 100b are moved with the movement of moving body 102 when in a state connected to moving body 102, and are not moved even when moving body 102 is moved when in a state disconnected from moving body 102. Due to this, moving body 102 has a function as one constituent element of the driving transmission section that transfers drive of shuttle motor 122 and rotation cylinder 140 to arm units 100a and 100b. In addition, the two arm units 100a and 100b are linked to each other in a state in which the two arm units 100a and 100b are connected to moving body 102. Due to this, moving body 102 also has a function as a linking body that links the two arm units 100a and 100b.

Spline nuts 150a and 150b are held by nut holding sections 152a and 152b so as to be able to rotate integrally, and nut holding sections 152a and 152b are held at both end portions of slider 134 in the x direction so that relative movement is possible around the x-axis and so as to be able to move integrally in the x direction.

Nut holding sections 152a and 152b form shapes with steps where there is a large diameter section and a small diameter section, the sides where the nut holding sections 152a and 152b oppose each other are set as large diameter sections 153a and 153b, and the arm unit sides of nut holding sections 152a and 152b are set as small diameter sections 154a and 154b. Spline nuts 150a and 150b each fit together in a fixed manner in the large diameter sections 153a and 153b.

Figure 7A:
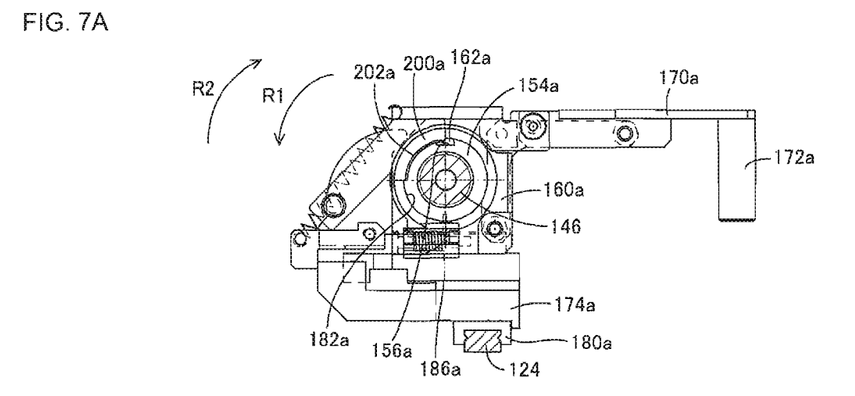
FIGS. 7A to 7C are diagrams illustrating rotation states of the arm.

Unit rotating bodies 160a and 160b of arm units 100a and 100b each fit together in the small diameter sections 154a and 154b so as to be able to rotate integrally. For example, keys 162a and 162b provided for unit rotating bodies 160a and 160b may be engaged with key grooves 156a and 156b formed in the outer peripheral surface of the small diameter sections 154a and 154b (156a and 162a are shown in FIG. 7).

Connection recessed sections 164a and 164b, which each extend in a direction that intersects with the x direction, are provided in end portions of the large diameter sections 153a and 153b on the small diameter section sides and are used in connection to arm units 100a and 100b. In addition, grooves 163a and 163b with an annular shape where the tangent is orthogonal to the x direction are formed in each of the end portions of the large diameter sections 153a and 153b on the opposite side from the small diameter sections 154a and 154b. Protruding sections 165a and 165b that each protrude in the z direction are provided on both end portions of slider 134 in the x direction. Nut holding sections 152a and 152b are held in slider 134 in a state in which protruding portions 165a and 165b engage with grooves 163a and 163b with the annular shape, in detail, in a state in which both side surfaces of protruding sections 165a and 165b face the wall portions of grooves 163a and 163b with the annular shape in the x direction. Due to this, nut holding sections 152a and 152b are able to move with movement of slider 134 in the x direction. In addition, movement of nut holding sections 152a and 152b in the x direction that accompanies rotation is favorably prevented by guiding rotation of nut holding sections 152a and 152b around the X-axis.

Arm Units

The two arm units 100a and 100b form shapes that are symmetrical to each other with respect to the z-axis and have the same structures. Arm unit 100a will be described below; for arm unit 100b, in the drawings, the subscript b is given to the same numbers as the corresponding members of arm unit 100a; however, descriptions of arm unit 100b are omitted. Arm unit 100a includes arm 136a and arm holding section 166a that holds arm 136a. Arm 136a includes main body section 170a that generally extends in the x direction and is held on arm holding section 166a at the base portion, and claw 172a as the engaging section that is provided at a tip end portion that protrudes in the y direction to the opposite side from the base portion of main body section 170a. Claw 172a protrudes downward from main body section 170a and is able to engage with board P.

In addition, as shown in FIGS. 4 and 5, the spacing L0 between claws 172a and 172b becomes larger since arms 136a and 136b each extend in directions so as to disengage from moving body 102 in a state in which the two arm units 100a and 100b are connected to moving body 102. In the present embodiment, the spacing L0 is substantially the same length as the length of rails 92p and 92q of board holding section 60. In addition, claw 172a is positioned on the downstream side end portion of shuttle 112 in a case where board P is conveyed in direction x1 and is positioned on the upstream side end portion of shuttle 112 in a case where board P is conveyed in direction x2. For this reason, claw 172a is applied to cases where board P is conveyed in direction x2.

Arm holding section 166a includes each of holding section main body 174a and unit rotating body 160a. Unit rotating body 160a is held on holding section main body 174a so that relative movement around the x-axis is possible and arm 136a is held with respect to holding section main body 174a so that rotation is possible via link mechanism 178a (refer to FIG. 7).

Holding section main body 174a includes engaging section 180a for shuttle guide 124, is not able to rotate, and is able to move horizontally in a linear manner in the x direction.

Through-hole 182a that extends in the x direction is formed in a central portion of unit rotating body 160a and is in a state in which the small diameter section 154a of nut holding section 152a is inserted into through-hole 182a so as to be able to be inserted and removed. Lever 186a is held on the outer side of unit rotating body 160a so as to be able to rotate around rotation shaft 188a that extends in the y direction. The length of lever 186a in the x direction is longer than unit rotating body 160a and protrudes from both sides of unit rotating body 160a in the x direction. Also, connection claw 190a is provided on the surface on the inner peripheral side of the end portion of lever 186a on the moving body side to protrude toward the inner peripheral side, and inclined portion 192a is provided on the surface on the outer peripheral side of the end portion of lever 186a on the opposite side from moving body 102 (the end portion on the stopping device side). As shown in FIG. 8(4) and FIG. 9(4), inclined portion 192a is inclined in the peripheral direction of unit rotating body 160a with an orientation so that the thickness increases (the outer surface protrudes to the outer peripheral side) from the front to the rear in the R1 direction. Lever 186a is able to rotate between a connection position where connection claw 190a engages with connection recessed section 164a of nut holding section 152a of moving body 102 and a disengaged position where connection claw 190a is disengaged from connection recessed section 164a and is biased toward the connection position by spring 196a that is provided on rotation shaft 188a. In addition, rotation engaging protruding section 200a with an arc shape that protrudes in the x direction is provided on an end portion of through-hole 182a on unit rotating body 160a on the stopping device side. Engagement claw 202a {refer to FIGS. 7, 8(3) and 8(4)} with an arc shape that protrudes to the inner peripheral side is provided on a tip end portion of rotation engaging protruding section 200a.

Figure 7B:
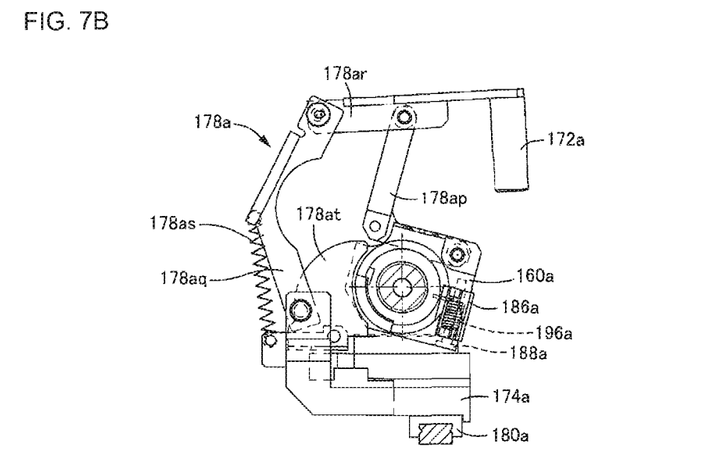
Figure 7C:
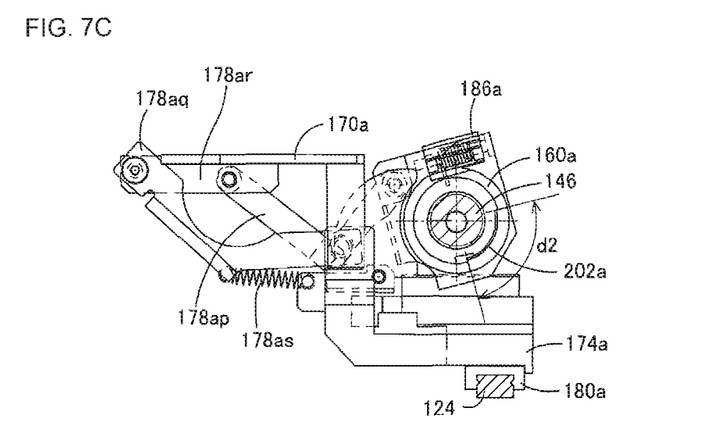
Figure 8:
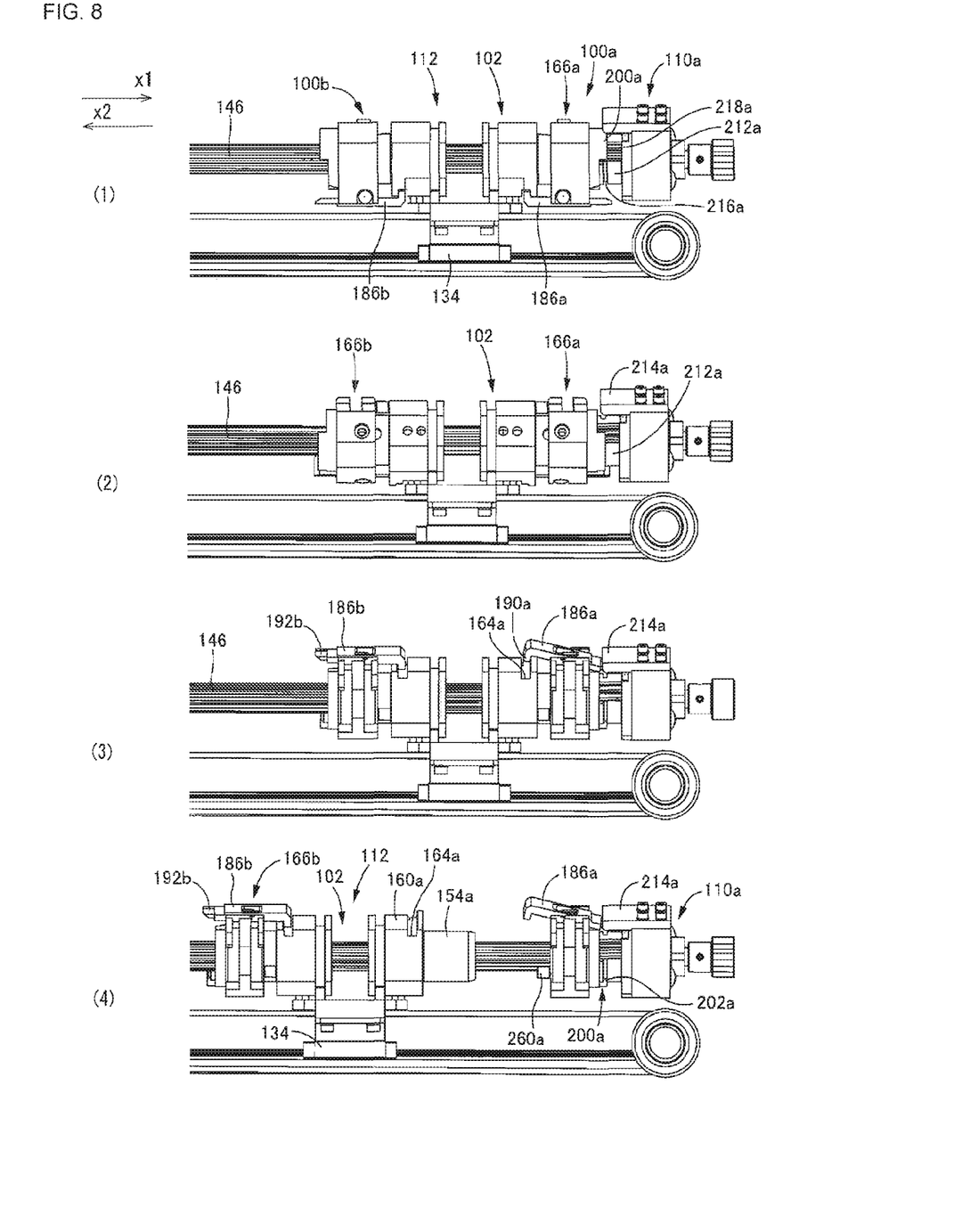
Figure 9:
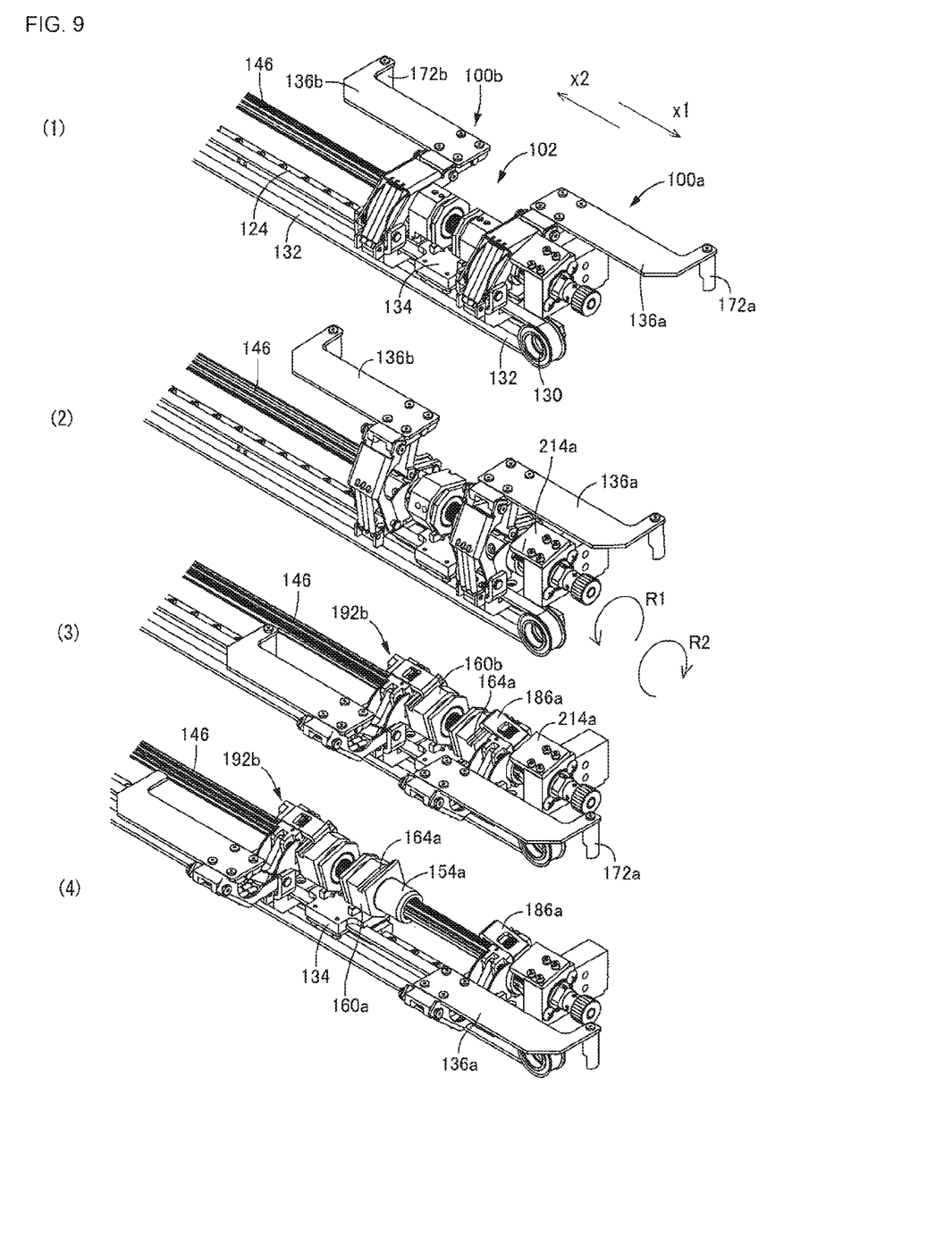

As shown in FIGS. 7(a) to 7(c), link mechanism 178a includes (1) first rod 178ap that is linked to unit rotating body 160a such that relative rotation is possible, (2) second rod 178aq that is linked to holding section main body 174a such that relative rotation is possible, (3) third rod 178ar that is linked to first rod 178ap and second rod 178aq such that relative rotation is possible and that holds arm 136a, (4) spring 178as that imparts an elastic force onto second rod 178aq toward holding section main body 174a, (5) cam 178at that is provided on holding section main body 174a and that guides movement of first rod 178ap, and the like. Arm 136a is movable using link mechanism 178a between an operable position where it is possible for claw 172a to engage with board P that is on conveyance belts 74p, 74q, 86p, and 86q or rails 92p and 92q as shown in FIG. 7(a) and a retraction position where claw 172a is disengaged from board P as shown in FIG. 7(c).

Stopping Device

Stopping devices 110a and 110b (refer to FIG. 3) switch claws 172a and 172b between a state in which claws 172a and 172b are able to convey board P and a stopping state, and maintain the stopping state. The stopping state is a state of not moving horizontally in a linear manner even when shuttle motor 122 is in an operational state and of not rotating even when spline shaft 146 is rotating, and is able to be also be referred to as a stationary state.

Stopping devices 110a and 110b are provided at positions which are outside the range of movement of shuttle 112 during conveyance of board P, in the present embodiment, on both end portions of spline shaft 146, and also have a function as stoppers.

Since stopping devices 110a and 110b are symmetrical with respect to the z-axis and have the same structure, stopping device 110a will be described below and description of stopping device 110b will be omitted.

As shown in FIG. 6, stopping device 110a is provided on the main body of board conveyance device 14 (on guide 50 or the like) in a fixed manner and includes (a) main body 210a, (b) engaging section 212a that is generally formed in a cylindrical shape and provided on the outer periphery of spline shaft 146, (c) plate 214a as a lever rotating section that is provided on main body 210a to protrude in the x direction above engaging section 212a, and the like. Annular recessed section 216a with generally an annular shape is provided at an intermediate portion of engaging section 212a in the axial direction and cutout 218a that extends in the axial direction is provided across annular recessed section 216a. Length (the size of spacing) d1 of cutout 218a in the circumferential direction is set to be slightly larger than length d2 {refer to FIG. 7 (c)} of engagement claw 202a of rotation engaging protruding section 200a in the circumferential direction (d1 d2) and claw 202a is able to be engaged with cutout 212a.

Control Device

Control device 250, formed mainly of a computer, is provided in the electronic component assembly device. Control device 250 is connected to shuttle position sensor 252, arm rotation position sensor 254, and the like and is connected to shuttle motor 122, electromagnetic valve 148, and the like. Shuttle position sensor 252 detects the position of shuttle 122 in the x direction and detects whether shuttle 122 has reached an end position that is set in advance. Arm rotation position sensor 254 detects the position of movable member 142 of rotation cylinder 140 in the z direction and detects whether arms 136a and 136b are at the operable position or the retraction position.

Operations of Board Conveyance Device

Board Conveyance

A case where the conveyance direction is x1 will be described for the present embodiment.

Shuttle conveyance device 62 is normally in a state in which each of the arm units 100a and 100b (the claws 172a and 172b) are connected to moving body 102, that is, in a state in which the two arm units 100a and 100b are linked via moving body 102. The two claws 172a and 172b are moved horizontally (simultaneously) in an integrated manner and the two arms 136a and 136b are integrally rotated. In this state, two substrates are simultaneously conveyed using the two claws 172a and 172b in a case where a length L of board P in the x direction is smaller than a spacing L0 between the two claws 172a and 172b.

In addition, on board conveyance device 14, the predetermined position above conveyance belts 74p and 74q on first conveyance device 56 is set as the standby position, the predetermined position above rails 92p and 92q of board holding section 60 is set as the mounting position (insertion position or working position), and the predetermined position above conveyance belts 84p and 84q on second conveyance device 58 is set as the discharge position. Board P is conveyed from the standby position to the mounting position and from the mounting position to the discharge position.

Figure 11A:
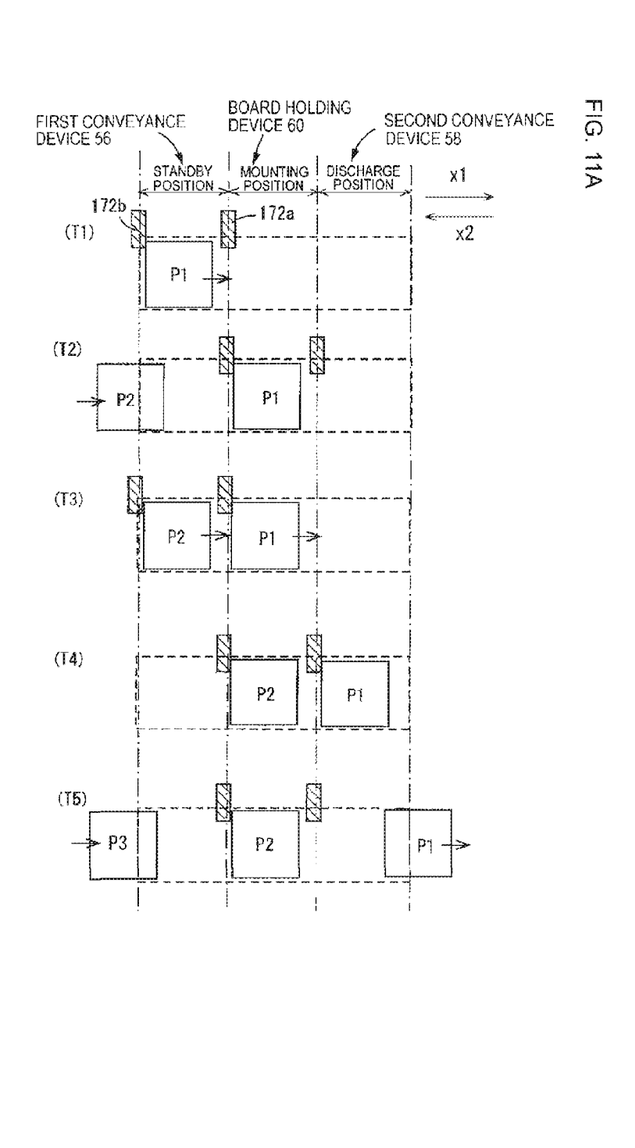
FIG. 11A is a diagram illustrating a conveyance state in a case where two arms are in an operational state.

The operations in this case will be simply described based on FIG. 11 (a). (T1) A board P1 that is conveyed to the standby position is moved in the x1 direction by being pushed from behind by claw 172b. (T2) When the board P1 is moved to the mounting position, the two arms 136a and 136b are rotated to the retraction position and are moved horizontally to the standby position (return in the x2 direction). Work such as insertion of lead components, cutting of lead wires, or clinching is performed on the board P1 in a state in which the board P1 is clamped using rails 92p and 92q and clampers 94p and 94q. (T3) When the work with respect to the board P1 is completed, the clamping is released. In addition, a board P2 which is introduced to the standby position is moved in the x1 direction by being pushed by claw 172b. When claw 172a abuts with the board P1, claws 172a and 172b simultaneously move the boards P1 and P2 in the x1 direction. (T4) The board P2 is moved to the mounting position and the board P1 is moved to the discharge position. (T5) The board P1 is discharged using second conveyance device 58, which is on the OUT side, and a subsequent board P3 is introduced to the standby position. (T3) to (T5) are repeatedly performed hereinafter.

In addition, when the boards P1 and P2 are moved using claws 172a and 172b, conveyance belts 74p, 74q, 84p, and 84q of first conveyance device 56 and second conveyance device 58 are driven. Due to this, prevention of friction between conveyance belts 74p, 74q, 84p, and 84q, reduction in the load of claws 172a and 172b and arms 136a and 136b, an increase in the speed of board conveyance, and the like are achieved.

In this manner, two boards P are simultaneously conveyed using the two claws 172a and 172b. The sum (t1+t2) of time period t1 necessary for the board P that is at the standby position to be moved to the mounting position, and time period t2 (=t1) necessary for the board P that is at the mounting position to be moved to the discharge position after work is completed, is referred to as the time period for loading; the time period for loading is set as t1 in this embodiment and is shorter compared to a case where boards are conveyed one at a time since movement from the mounting position to the discharge position and movement from the standby position to the mounting position are simultaneously performed.

In contrast to this, claw 172a is in the stopping state in a case in which the length L of the board P is larger than spacing L0. One board P is conveyed in the x1 direction by claw 172b; operations in this case will be described based on FIG. 11(b).

Figure 11B:
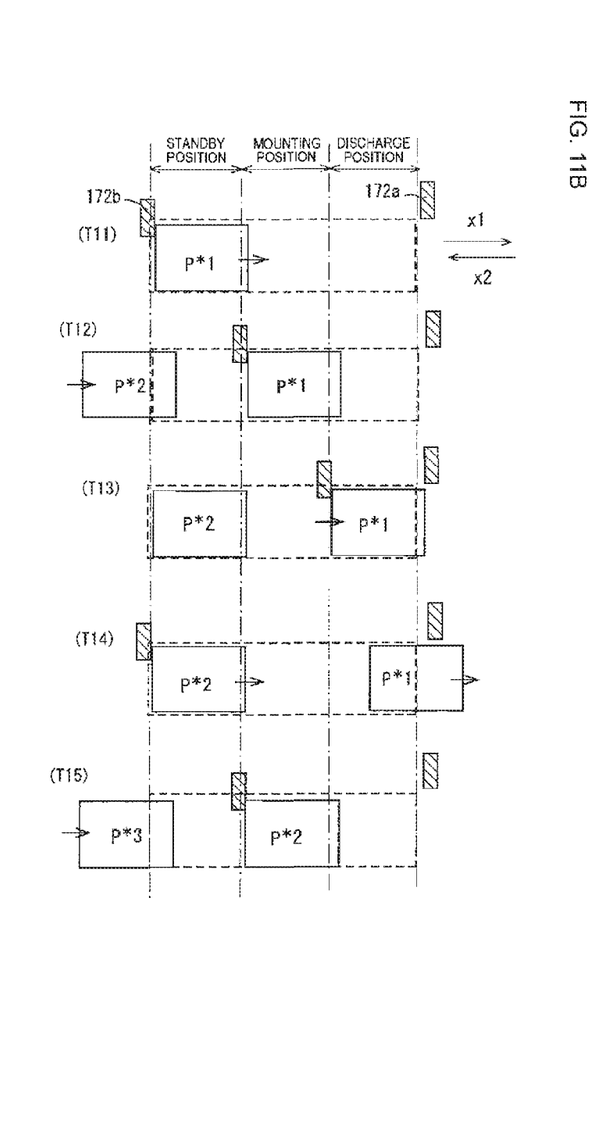
FIG. 11B is a diagram illustrating a conveyance state in a case where one arm is in a stopping state.

(T11) Board P*1 that reaches the standby position is moved to the mounting position by being pushed from behind by claw 172b. (T12) When the work on board P*1 is completed, (T13) claw 172b moves the board P*1 to the discharge position. (T14) Arm 136b is rotated to the retraction position and is moved horizontally to the standby position. (T15) Arm 136b is rotated to the operable position and claw 172b moves a subsequent board P*2 that is introduced to the standby position to the mounting position while pushing from behind. In addition, the board P*1 that is at the discharge position is discharged using OUT conveyance device 58. (T13) to (T15) are repeatedly performed hereinafter.

In this manner, in a case where the length L of the board P is larger than L0, the board P is conveyed using claw 172b since claw 172a is in the stopping state; the time period for loading in this case is the sum (t*1+t*2) of time period t*1 for movement from the standby position to the mounting position and time period t*2 for movement from the mounting position to the discharge position.

Automatic Stopping of Claws

In a case where it is not possible for the board to be conveyed using the two claws 172a and 172b, one claw 172, which is determined based on the conveyance direction of the board P, out of claws 172a and 172b is selectively set to the stopping state. Claw 172a is in the stopping state in a case where the conveyance direction is x1 and claw 172b is in the stopping state in a case where the conveyance direction is x2.

In addition, claw 172a is automatically set to the stopping state in a case where the length L of the conveyed board P is larger than spacing L0. Claw 172a is set to the stopping state by controlling shuttle horizontal moving device 104 and arm rotating device 108 in a case where it is determined that the length L of the board P is larger than spacing L0 based on information obtained from a production program that relates to the size of the conveyed board P.

Figure 10B:
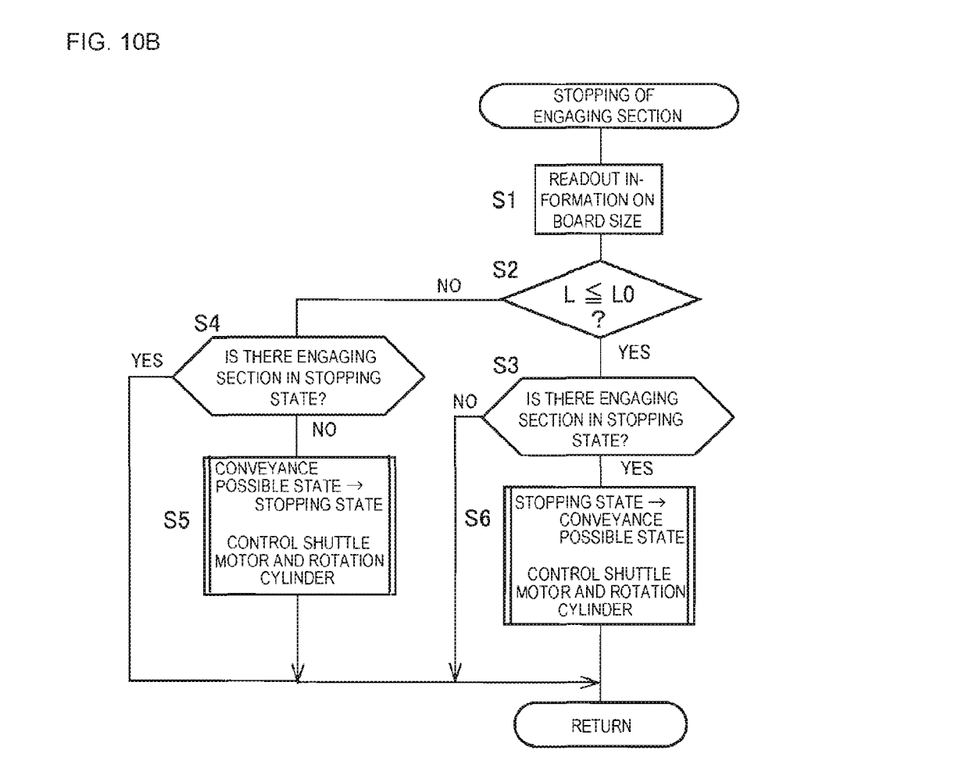
FIG. 10B is a flowchart of an arm state switching control program that is stored in a memory section in the control device.

An engaging section stopping program represented by the flowchart in FIG. 10 is executed by control device 250.

In step 1 (hereinafter abbreviated to S1 with the same also applying to the other steps), information that relates to substrate size is read out, and it is determined whether the length L of the board P is a size which is equal to or less than spacing L0 in S2. In a case where the length L of the board P is equal to or less than L0, it is determined whether there is a claw which is in the stopping state (whether claw 172a is in the stopping state) in S3. There are no changes in a case where claw 172a is in a state in which conveyance is possible. In contrast to this, in a case where the length L of the board P is greater than L0, the determination in S2 is NO and it is determined whether claw 172a is in the stopping state in S4. In a case where claw 172a is not in the stopping state, claw 172a is automatically set to the stopping state in S5.

Claw 172a is set to the stopping state by disconnecting the one arm unit 100a from a state in which the two arm units 100a and 100b are connected to moving body 102; operations in this case will be described based on FIGS. 8 and 9.

(1) The shuttle 112 is moved in direction x1 (to the downstream side) using shuttle motor 122. Arm holding section 166a is allowed to approach stopping device 110a in the x direction since arm holding section 166a and stopping device 110a are in a relative phase relationship in which engagement claw 202a opposes cutout 218a with arm 136a in the operable position. In addition, the inner peripheral surface of through-hole 182a is moved in the x direction along the outer peripheral surface of engaging section 212a since the outer diameter of engaging section 212a and the outer diameter of the small diameter section 54a are substantially the same. Shuttle motor 122 stops when arm holding section 166a reaches the end position, where it is possible for engagement claw 202a to fit together with annular recessed section 216a.

(2) Rotation cylinder 140 is operated by control of electromagnetic valve 148 and spline shaft 146 is rotated in direction R1 in FIGS. 8 and 9. Unit rotating bodies 160a and 160b are rotated in direction R1 and arms 136a and 136b are rotated from the operable position to the retraction position as shown in FIG. 7(a) to FIG. 7(c). In addition, engagement claw 202a is rotated along annular recessed section 216a and engagement claw 202a reaches a position where engagement claw 202a separates from cutout 218a. At this position, movement of unit rotating body 160a from engaging section 212a in the x direction is prevented.

(3) Lever 186a is rotated to the disengaged position using lever rotating section 214a accompanying rotation of unit rotating bodies 160a and 160b in direction R1. Arm holding section 166a is separated from moving body 102. In this case, insertion to below lever rotating section 214a is easy and the rotation angle becomes large accompanying rotation due to inclined portion 192a that is provided on lever 186a. Note that, as is clear from (1) and (3), unit rotating body 160a is rotated by 180 degrees or more. In addition, since arm unit 100b is disengaged from stopping device 110b, lever 168b remains at the connection position without any changes even if unit rotating body 160b is rotated.

(4) Shuttle motor 122 is rotated in the reverse direction, moving body 102 and arm unit 100b are moved to the upstream side, that is, in direction x2, and moving body 102 is disengaged from arm unit 100a. Arm unit 100a is disconnected from moving body 102.

After this, arm holding section 166a remains in a state of being held by engaging section 212a of stopping device 110a without change. Since the small diameter section 154a of nut holding section 154a does not fit together with arm holding section 166a, unit rotating body 160a does not rotate even if spline shaft 146 rotates and there is no movement in the x direction even in a state in which shuttle motor 122 is in an operational state. Arm holding section 166a is in a stationary state and claw 172a is held in the stopping state. Furthermore, the phase of arm holding section 166a is held at the retraction position of arm 136a due to the elastic force of spring 178as, the stopper structure of link mechanism 178a, the weight of arm 136a, and the like. The phase and the position of arm holding section 166a in the axial direction are maintained in stopping device 110a without change from the state in (4).

Meanwhile, in a case where the length L of the board P is equal to or less than L0 and claw 172a is in the stopping state, the determination in S2 and S3 is YES and claw 172a is returned from the stopping state to a state in which conveyance is possible in S6. In this case, shuttle motor 122, rotation cylinder 140, and the like are controlled in the reverse sequence to the case described above.

(4) Shuttle 112 (moving body 102 and arm unit 100b) is moved in direction x1 to the retraction position of arm 136b. The small diameter section 154a of nut holding section 152a of moving body 102 is fitted into through-hole 182a of arm holding section 166a. Unit rotating body 160a is in a state in which rotation is possible accompanying rotation of spline nut 150a due to engagement of key 162a and key groove 156a. Shuttle 112 is moved in the x direction until the step portion between the large diameter section 153a and the small diameter section 154a of nut holding section 152a abuts with stopper 260a, which is provided in arm holding section 166a. This position is the end position of shuttle 112. (3) Spline shaft 146 is rotated in direction R2 using rotation cylinder 140 and arms 136a and 136b are rotated from the retraction position to the operable position. (2) Lever 186a is separated from lever rotating section 214a and is returned to the connection position using spring 196a, and arm holding section 166a is connected to moving body 102. In addition, engagement claw 202a is set to a relative phase which opposes cutout 218a. Arm unit 100a is in a state in which disconnection from stopping device 110a is possible. (1) The arm unit 100a is moved in direction x2 along with moving body 102 and separates from stopping device 110a due to rotation of shuttle motor 122 in the reverse direction. Claw 172a is in a state where movement in the horizontal direction and rotation are possible due to operation of shuttle motor 122 and rotation cylinder 140 and is in a state where conveyance is possible.

In addition, in a case where the board P is conveyed in direction x2 direction, claw 172b is selected out of the two claws 172a and 172b and is set to the stopping state using stopping device 110b. Operation of shuttle motor 122 and rotation cylinder 140 are substantially the same as the case where claw 172a is set in the stopping state.

The selective stopping device is configured in the embodiment above using stopping devices 110a and 110b, shuttle motor 122, electromagnetic valve 148, rotation cylinder 140, and parts in control device 250 for storing the engaging section stopping program and parts in control device 250 for executing the engaging section stopping program, which is represented by the flowchart in FIG. 10, and the like. The selective stopping device is also a selective movement stopping section, a selective rotation stopping section, and a selective horizontal movement stopping section. In addition, the holding section disconnecting section is configured using lever rotating sections 214a and 214b, the rotating body is configured using spline nuts 150a and 150b, nut holding sections 152a and 152b, and the like, and the engaging section holding section is configured using arm holding sections 166a and 166b and the like. Furthermore, the rotation actuator is configured using spline shaft 146 and the like, and the horizontal movement actuator is configured using shuttle conveyance belt 132 and the like. In addition, shuttle horizontal moving device 104 and arm rotating device 108, which is the engaging section rotating device, are moving devices, and the board conveyance device in the present embodiment includes these two moving devices.

In addition, the board conveyance device is able to switch between a first conveyance state in which it is possible to convey two sheets (the first set number of sheets) of boards using the two (the first set number of units) claws 172a and 172b and a second conveyance state in which it is possible to convey one sheet (the second set number of sheets) of board using either one (the second set number of units) out of the claws 172a and 172b, and the selective stopping device described above also functions as the conveyance state switching device.

In this manner, it is possible to improve the ease of use of the board conveyance device in the present embodiment in a case where two claws 172a and 172b are in operable states, since it is possible to shorten the time period for loading and it is possible to also convey large boards if one claw 172a is in the stopping state.

In addition, it is possible to automatically switch each of the claws 172a and 172b between the operation possible state and the stopping state based on the size of the board.

Furthermore, it is possible for either of the claws 172a and 172b determined depending on the conveyance direction of the board to be selectively set to the stopping state since stopping devices 110a and 110b are provided at both end portions of shuttle conveyance device 62. Note that, it is not essential that both stopping devices 110a and 110b are provided and it is sufficient if only one is provided in a case where the conveyance direction is determined in advance.

In addition, in a case where claws 172 are switched between the state where conveyance is possible and the stopping state, it is possible for starting, stopping, and the like of shuttle motor 122 to be performed based on the detection values of shuttle position sensor 252, to be performed based on increases in the current that flows through shuttle motor 122 due to shuttle 112 abutting with a stopper or the like, and the like.

In addition, the device at the mounting position for the board P is not limited to a device for cutting or clinching and it is possible for the disclosure to be applied to a device which performs soldering and the like, and it is possible to be widely applied to component assembly devices.

Other than this, the present disclosure is not limited to the aspects described above in the embodiment, and execution is possible using aspects in which various modifications and alterations other than those described above are used based on the knowledge of someone skilled in the art.

REFERENCE SIGNS LIST

62: shuttle conveyance device, 100: arm unit, 102: moving body, 104: arm horizontal moving device, 108: arm rotating device, 110: stopping device, 122: shuttle motor, 134: slider, 136: arm, 140: rotation cylinder, 148: electromagnetic valve, 146: spline shaft, 160: nut holding section, 150: spline nut, 166: arm holding section, 164: connection recessed section, 176: rotating body, 186: lever, 190: connection claw, 192: inclined portion, 212: engaging section, 214: lever rotating section, 216: annular recessed section, 218: cutout, 250: control device

The invention claimed is:

1. A board conveyance device comprising:
multiple engaging sections that are able to engage with a circuit board;
a selective stopping device that selectively sets one out of the multiple engaging sections to be in a stopping state; and
a moving device including an actuator that moves the multiple engaging sections, and a driving source which drives the actuator,
wherein one or more circuit boards is conveyed using one or more out of the multiple engaging sections excluding the one engaging section that is set to be in the stopping state by the selective stopping device, and
wherein the selective stopping device includes a selective movement stopping section that sets one out of the multiple engaging sections to be in the stopping state, which is a state in which the engaging section does not move even when the driving source is in an operational state.

2. The board conveyance device according to claim 1,
wherein the actuator is a rotation actuator that rotates the multiple engaging sections between an operable position where engagement with the circuit board is possible and a retraction position where the multiple engaging sections are disengaged from the circuit board,
the driving source is a rotation driving source that drives the rotation actuator,
the moving device is an engaging section rotating device provided with the rotation actuator and the rotation driving source, and
the selective stopping device includes a selective rotation stopping section that sets one out of the multiple engaging sections to be in the stopping state, which is a state in which the engaging section does not rotate even when the rotation driving source is in an operational state.

3. The board conveyance device according to claim 2,
wherein the engaging section rotating device includes a rotating body that is rotated by the rotation actuator, the board conveyance device includes a multiple engaging section holding sections each of which is provided to correspond to each of the multiple engaging sections, holds each of the engaging sections, and which are able to be connected to and disconnected from the one rotating body, and
the selective stopping device includes a holding section disconnecting section that sets one out of the multiple engaging sections to be in the stopping state by disconnecting an engaging section holding section that corresponds to the one out of the multiple engaging sections from the rotating body.

4. The board conveyance device according to claim 1,
wherein the actuator is a horizontal movement actuator that moves the multiple engaging sections horizontally in a conveyance direction of the circuit board,
the driving source is a horizontal movement driving source that drives the horizontal movement actuator, and
the selective stopping device includes a selective horizontal movement stopping section that sets one out of the multiple engaging sections to be in the stopping state that is a state in which the engaging section does not move in the conveyance direction even when the horizontal movement driving source is in an operational state.

5. A board conveyance device, which conveys multiple circuit boards that are engaged with multiple engaging sections by moving the multiple engaging sections using one driving source, comprising:
a conveyance state switching device that is able to switch between a first conveyance state in which it is possible to convey a first set number of circuit boards using a first set number of engaging sections out of the multiple engaging sections and a second conveyance state in which a second set number of circuit boards are conveyed using a second set number of engaging sections out of the multiple engaging sections, the second set number being smaller than the first set number.

* * * * *